United States Patent [19]
Egan

[11] Patent Number: 5,304,956
[45] Date of Patent: Apr. 19, 1994

[54] LOW NOISE HIGH SPEED FREQUENCY SYNTHESIZER EMPLOYING A LEARNING SEQUENCE

[75] Inventor: William F. Egan, Cupertino, Calif.
[73] Assignee: TRW Inc., Redondo Beach, Calif.
[21] Appl. No.: 916,295
[22] Filed: Jul. 17, 1992
[51] Int. Cl.$^5$ .............................................. H03L 7/189
[52] U.S. Cl. ........................................ 331/10; 331/14; 331/16; 331/17; 331/25
[58] Field of Search ................ 331/10, 11, 14, 16, 331/17, 25

[56] References Cited
U.S. PATENT DOCUMENTS

| | | | |
|---|---|---|---|
| 4,410,860 | 10/1983 | Kipp et al. | 331/1 A |
| 4,511,858 | 4/1985 | Charavit et al. | 331/10 |
| 4,980,652 | 12/1990 | Tarusawa et al. | 331/1 A |

Primary Examiner—Siegfried H. Grimm
Attorney, Agent, or Firm—Ronald L. Taylor

[57] ABSTRACT

Disclosed is an apparatus and method for high speed tuning to a commanded frequency using a low noise high speed frequency synthesizer employing a learning sequence. A phase-locked loop (PLL) generates the commanded frequency. High speed tuning circuitry high speed tunes the PLL to the commanded frequency. Thereafter, the high speed tuning circuitry is substantially isolated from the PLL, while learning circuitry is employed to learn a correction signal which will enable subsequent more accurate high speed tuning to the commanded frequency.

22 Claims, 3 Drawing Sheets

LOW NOISE HIGH SPEED FREQUENCY SYNTHESIZER EMPLOYING A LEARNING SEQUENCE

BACKGROUND OF THE INVENTION

1. Technical Field

This invention relates generally to a frequency synthesizer and, more particularly, to a low noise high speed frequency synthesizer employing a learning sequence to enable high speed tuning of the frequency synthesizer to a commanded frequency.

2. Discussion Of The Related Art

Frequency synthesizers are known in the art for producing a desired output frequency which is an integral multiple of its reference frequency. The typical frequency synthesizer employs a phase-locked loop (PLL) for producing the desired output frequency. When configured as a frequency synthesizer, a PLL 10, as shown in FIG. 1, generally consists of a phase detector 12, a loop filter 14, a voltage controlled oscillator (VCO) 16 and a digital divider 18. In this configuration, the VCO 16 is operated at N times the reference frequency ($f_r$) and divided by N in the digital divider 18.

In operation, the output signal of the phase detector 12 consists of a DC component and an AC component. The DC component is proportional to the phase difference between the reference frequency and the closed loop frequency, while the AC component consists of remaining components from the reference frequency and its harmonics. The loop filter 14 removes the AC components and also acts as an integrator, thereby leaving only a DC control voltage. It should be noted that for reasons of clarity, the low pass filtering section of the loop filter 14, which does not bear fundamentally on the operation of the PLL 10, is not shown in FIGS. 1 through 4. The DC control voltage drives the VCO 16 to a commanded output frequency of N times the reference frequency ($f_r$). Later, if a new commanded frequency is desired, the digital divider 18 is adjusted by a command signal resulting in a change of the phase angle between the reference frequency and the closed-loop frequency. This in turn produces a change in the DC control voltage applied to the VCO 16, which subsequently drives the VCO 16 to a new commanded frequency.

To decrease the time it takes to tune the VCO 16 to the commanded frequency, thereby creating a high speed frequency synthesizer, coarse tuning is commonly employed, as shown in FIG. 2. A coarse-tune digital-to-analog converter (D/A) 20 rapidly tunes the VCO 16 to approximately the correct frequency, thus reducing the total time required to achieve the commanded frequency within the required accuracy. To further reduce this time, the accuracy of the coarse tune D/A 20 can be enhanced by learning circuits.

A learning circuit 21, shown in FIG. 2, uses both a coarse tune digital-to-analog converter (D/A) 20 and a fine tune digital-to-analog converter (D/A) 22 employing a learning sequence. This learning sequence memorizes a high speed fine tune signal which is used to more accurately tune the VCO 16 to the commanded frequency. Thus, later when the frequency synthesizer is commanded to a frequency at which learning has occurred, the memorized value is pulled from memory to set the VCO 16 to substantially the commanded frequency.

During a tuning sequence, the coarse tune D/A 20 and the digital divider 18 are both adjusted by command signals to tune the VCO 16 to the commanded frequency. A high speed coarse tune signal from the coarse tune D/A 20 is initially summed to the VCO 16 to set the VCO 16 to substantially the commanded frequency without the need for closed-loop tuning. The initial high speed course tune signal from the coarse tune D/A 20 thereby increases the overall tuning speed of the frequency synthesizer.

If the VCO 16 is not tuned substantially on the commanded frequency, a correction signal will be detected at the output of the loop filter 14. This correction signal is then applied to a fine tune analog-to-digital converter (A/D) 24 and stored in a random access memory (RAM) 26 until the next time the frequency synthesizer is commanded to the learned frequency. When the frequency synthesizer is commanded to the learned frequency, the digitized correction value stored in the RAM 26 is applied to the fine tune (D/A) 22 and its corresponding high speed fine tune signal is summed with the high speed coarse tune signal from the coarse tune (D/A) 20. The resultant high speed tuning signal is summed to the VCO 16, which should ideally tune the VCO 16 to the commanded frequency without the need for closed-loop tuning.

The learning circuit 21 meets the objective of having a very fast open-loop tuning resulting in very fast synthesizer tuning. However, the circuit 21 has several drawbacks inherent within its design. A first drawback is that noise on the D/A outputs, i.e., thermal noise, flicker noise, etc., is often high enough to adversely affect the synthesized spectrum. While special low noise D/A's could be designed, they would tend to be high power devices and thus not readily available. Since low noise D/A's are high power devices they are also unusable in many applications due to power or cooling restrictions. Furthermore, since noise density information for D/A's is generally not defined in D/A specification sheets or available from the manufacturer, the process of finding a low noise D/A is difficult. Therefore, many times a satisfactory circuit is not available for commercial use. Another drawback is that if any imperfections exist in the fine tune A/D 24 or D/A 22, the fine tune A/D 24 will always read this imperfection and place it back into the learning sequence. Thus, a correction signal from the phase detector 12 will always be required to make up any imperfections that exist in the fine tune A/D 24 and D/A 22.

To resolve the second drawback, the learning circuit 21 can be modified, as shown in FIG. 3, by relocating the point where the fine tune A/D 24 measures the total correction signal to a point where there is only an incremental correction signal. This incremented correction signal is then read and placed into an accumulator 28 which essentially increments the RAM 26 up or down depending on the incremental correction signal. The circuit 21 therefore removes any error that might result because of any imperfections that exist in the fine tune A/D 24 and D/A 22, thereby making the circuit 21 more accurate. However, use of this circuit results in greater complexity. Furthermore, the circuit 21 still includes the noise generated by the coarse tune D/A 20 and fine tune D/A 22 during steady-state operation of the frequency synthesizer.

To remove the noise sources during steady-state operation of the PLL 10 once tuning and phase-lock has been achieved, a different circuit is required. FIG. 4 shows a circuit 29 capable of performing these operations. A detailed discussion of the circuit 29 can be found in an article by Egan, William, "LOS Shared Circuitry To Synthesize 4 Frequencies", Microwaves, May, 1979. Essentially, the circuit 29 places a high speed tuning signal from the coarse tune D/A 20 on a capacitor 30 in the loop filter 14. Afterward, the coarse tune D/A 20 is removed from the circuit by a switch 32 thereby leaving only a high speed tuning voltage from the capacitor 30 on the VCO 16. Thus, the circuit 29 resolves the drawback of having a noise source in the circuit during steady-state operation after initial high speed open-loop tuning has occurred. However, the circuit 29 does not employ a learning sequence, nor is there a location to detect the error (correction signal) from the high speed open-loop tuning. Therefore, no learning of the correction signal occurs and subsequently any correction required to tune the VCO 16 to the commanded frequency must be made up by the phase detector 12 each time tuning to the commanded frequency occurs. This in turn makes tuning to a commanded frequency much slower and less efficient.

The existing circuits described each tunes the frequency synthesizer to a commanded frequency. However, each circuit has drawbacks associated with its use that affect either the accuracy, cost, noise problems, tuning speed, or any combination thereof. What is needed then is a low noise high speed frequency synthesizer which is capable of fast tuning to substantially the commanded frequency; capable of isolating noise sources during its steady-state operation; and capable of detecting a correction signal and employing it in subsequent tuning sequences. It is therefore an object of the present invention to provide such a device.

SUMMARY OF THE INVENTION

In accordance with the present invention, a low noise high speed frequency synthesizer employing a learning sequence is utilized to tune to a commanded frequency. This is basically achieved by high speed tuning the frequency synthesizer to a commanded frequency using high speed tuning circuitry, and isolating the high speed tuning circuitry from the frequency synthesizer once high speed tuning has occurred. This substantially removes any noise generated from the high speed tuning circuitry during steady-state operation of the frequency synthesizer. Thereafter, a correction signal is learned which will enable a subsequent more accurate high speed tuning.

In one preferred embodiment, a phase-locked loop (PLL) generates the commanded frequency by adjusting a voltage controlled oscillator (VCO) within the PLL. Initially, the VCO is adjusted to substantially the commanded frequency by a high speed coarse tune signal from a coarse tune digital-to-analog converter (D/A). The course tune D/A is then isolated from the steady-state operation of the PLL. Thereafter, a correction signal is generated by a phase detector which is subsequently learned by employing a fine tune analog-to-digital converter (A/D) and a random access memory (RAM). The learned correction signal is subsequently used to enable a more accurate high speed tuning the next time the learned commanded frequency is desired.

After the learning has occurred, and tuning to the learned commanded frequency is desired, the high speed coarse tune signal from the coarse tune D/A is summed with an additional high speed fine tune signal from a fine tune digital-to-analog converter (D/A), which corresponds to the learned correction signal. The resultant high speed tuning signal more accurately tunes the VCO to substantially the commanded frequency. Thereafter, the coarse tune D/A and the fine tune D/A are substantially isolated from the steady state operation of the PLL, thereby removing any noise generated by the coarse tune D/A and fine tune D/A.

Use of the present invention results in obtaining high speed tuning to a commanded frequency by employing a learning sequence in a frequency synthesizer while isolating noise sources internal to the frequency synthesizer during steady-state operation. As a result, the aforementioned problems associated with the currently available frequency synthesizers have been substantially eliminated.

BRIEF DESCRIPTION OF THE DRAWINGS

Still other advantages of the present invention will become apparent to those skilled in the art after reading the following specifications and by reference to the drawings in which.

DETAILED DESCRIPTION OF THE PREFERRED EMBODIMENT

The following description of the preferred embodiment concerning low noise high speed frequency synthesizers is merely exemplary in nature and is no way intended to limit the invention or its application or uses.

Figures 1, 2:
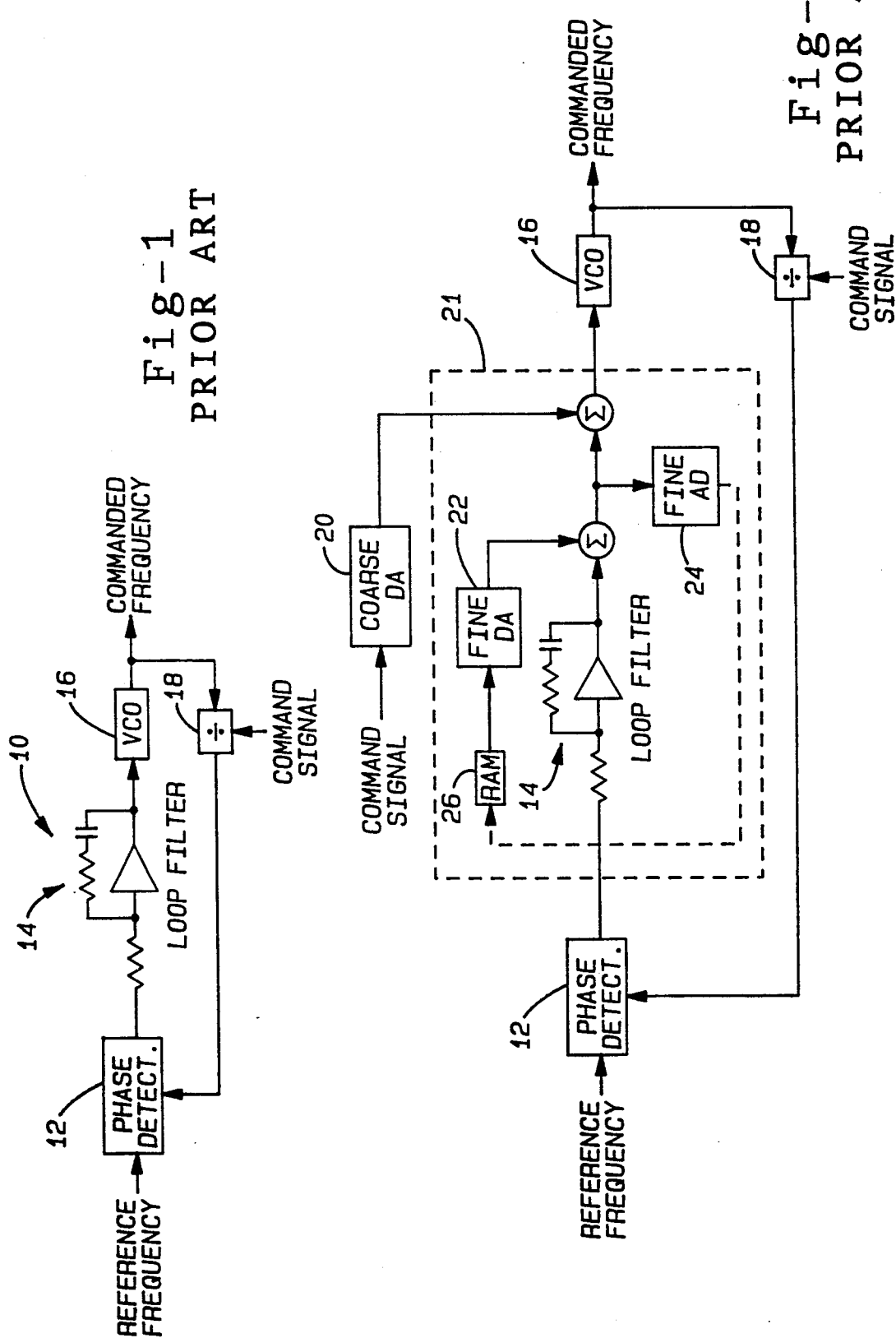
FIG. 1 is a prior art block diagram of a phase-locked loop (PLL) configured as a frequency synthesizer, including a phase detector, a loop filter, a voltage controlled oscillator (VCO) and a digital divider.
FIG. 2 is a modified prior art block diagram of the embodiment of FIG. 1 further including a coarse tune digital-to-analog converter (D/A), a fine tune digital-to-analog converter (D/A), a fine tune analog-to-digital converter (D/A), and random access memory (RAM)
Figures 3, 4:
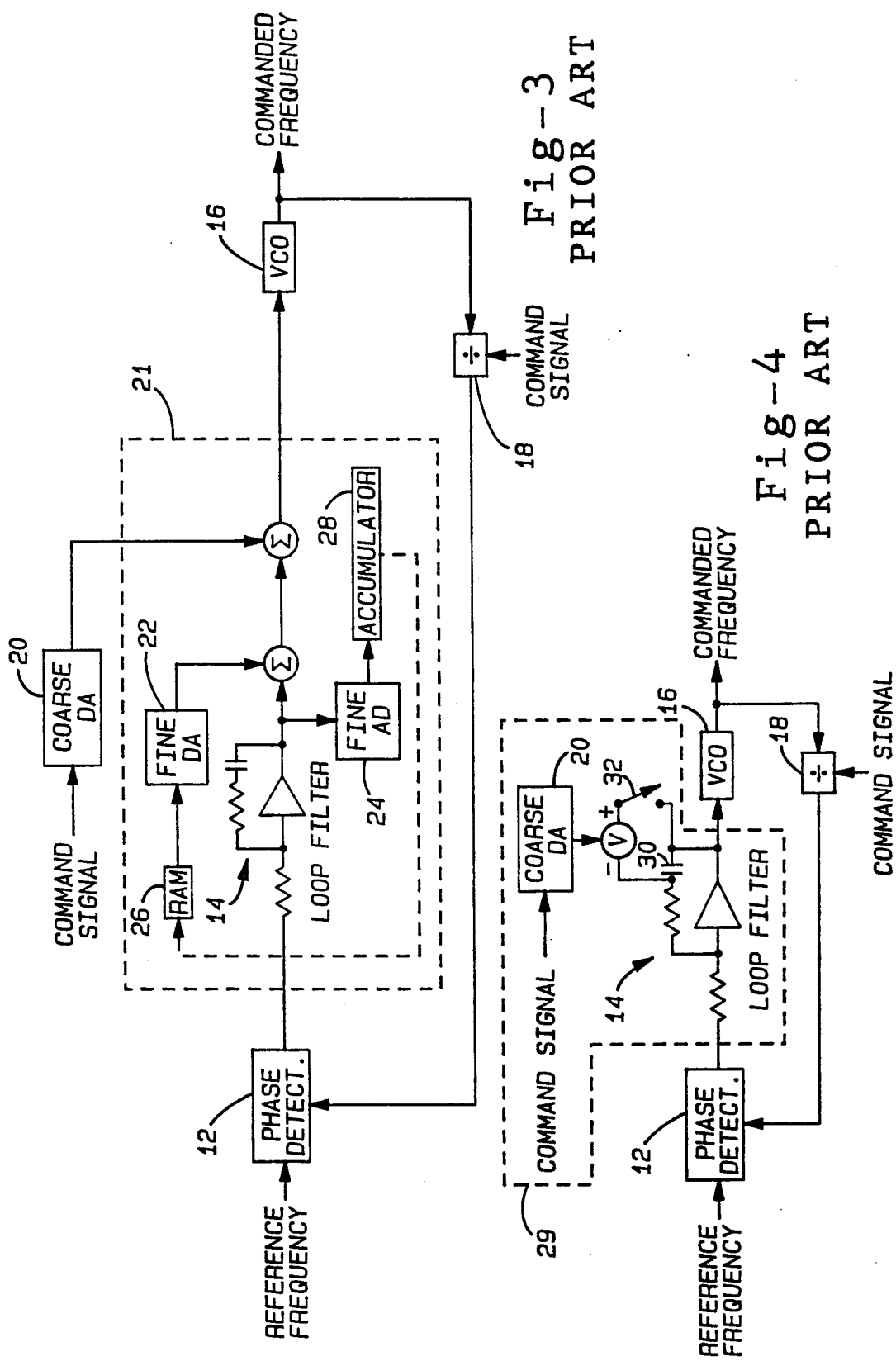
FIG. 3 is a modified prior art block diagram of the embodiment of FIG. 2 further including an accumulator.
FIG. 4 is a prior art block diagram of a phase-locked loop (PLL) configured as a frequency synthesizer including a removable coarse tune digital-to-analog converter (D/A)
Figure 5:
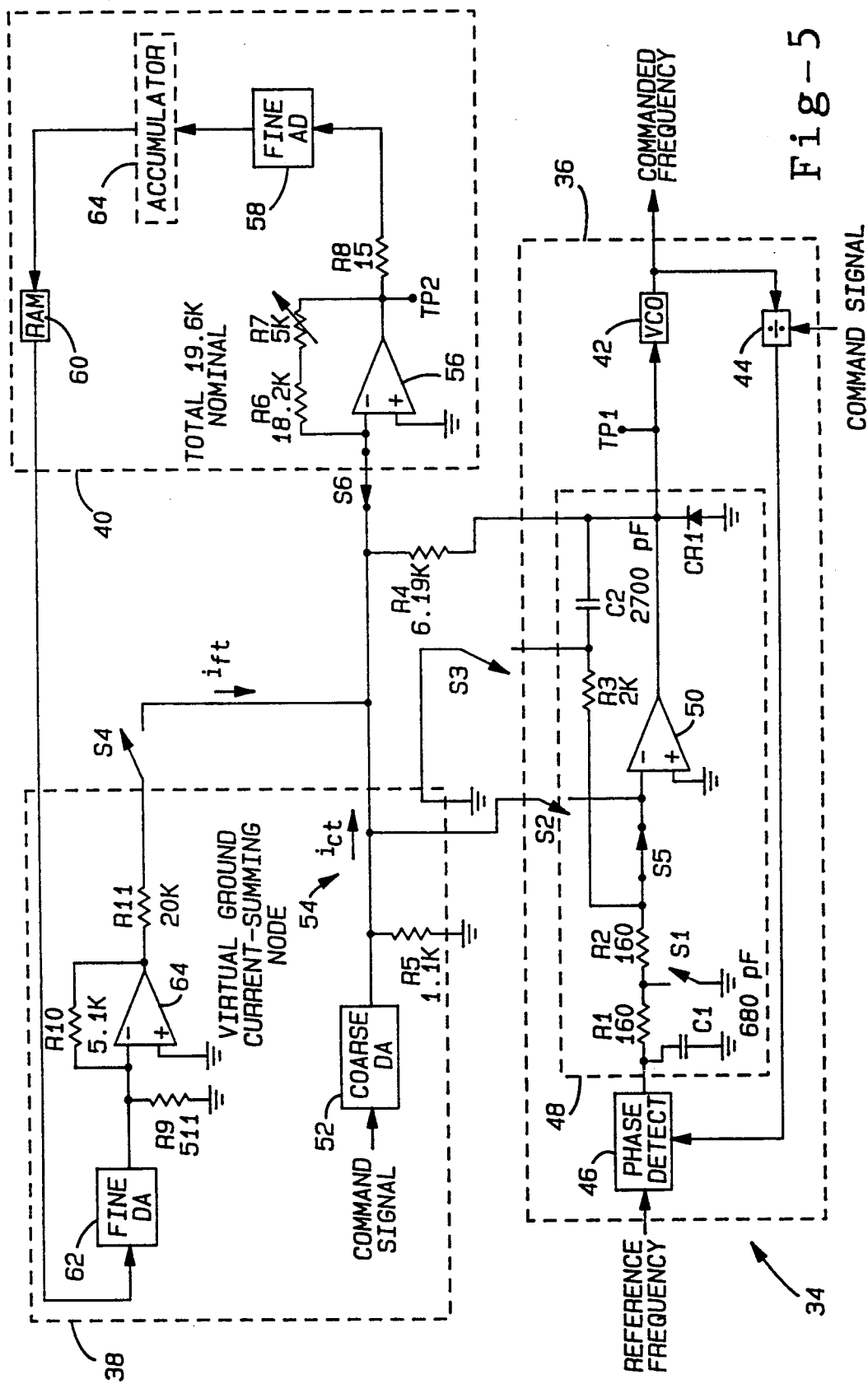
FIG. 5 is a schematic/block diagram of one preferred embodiment of the present invention including a phase-locked loop (PLL) configured as a low noise high speed frequency synthesizer.

Referring to FIG. 5, a schematic diagram of one preferred embodiment of a low noise high speed frequency synthesizer 34 employing a learning sequence, is shown. The frequency synthesizer 34 is shown operating in its steady-state closed synthesizer loop configuration. The frequency synthesizer 34 includes a phase-locked loop (PLL) 36 for generating a commanded frequency, high speed tuning circuitry 38 for high speed tuning the PLL 36 and learning circuitry 40 for learning a correction signal to enable more accurate subsequent tuning to a learned commanded frequency.

In the steady-state closed synthesizer loop operation, the PLL 36 generates the commanded output frequency, the high speed tuning circuitry 38 is isolated from the PLL 36 and the learning circuitry 40 is connected to PLL 36. In this configuration, the PLL 36 generates the commanded output frequency by driving a voltage controlled oscillator (VCO) 42 with a DC control voltage at test point 1 (TP1) to a commanded output frequency of N times a reference frequency ($f_r$). This commanded frequency is further divided by N in a digital divider 44 and the phase angle of its closed-loop output frequency is compared to the phase angle of the reference frequency ($f_r$) in a phase detector 46. If any phase difference exists between the two frequencies, the phase detector 46 will apply an output signal consisting of a DC component and an AC component to a loop filter 48. The DC component is proportional to the phase difference between the reference frequency and the closed loop output frequency, while the AC component consists of the remaining components from the reference frequency and its harmonics.

The output signal is applied to a low pass filter within the loop filter 48 consisting of series resistors R1 and R2 and shunt capacitor C1. However, one skilled in the art would readily recognize that the low pass filter can consist of various other configurations and components such as a notch filter, 3-pole low pass filter, etc. The low pass filter filters the AC components leaving primarily the DC component of the output signal. This DC signal is then applied to the negative input of an operational amplifier (op-amp) 50 configured as an integrator with a resistor R3 and a capacitor C2 feedback. The positive input of the op-amp 50 is connected to ground, while the negative input is connected to the feedback loop. Since the op-amp 50 ideally has an infinite input impedance, the output signal is driven through the feedback loop of the op-amp 50 to the cathode of diode CR1. The resultant output signal consists of the DC control voltage at TP1 which subsequently drives the VCO 42 to N times the reference frequency ($f_r$), thereby achieving phase-lock.

If the PLL 36 is only tuned using its closed-loop configuration, a command signal is applied to the digital divider 44, which in turn will change the phase angle between the reference frequency ($f_r$) and the resultant closed-loop frequency. This change in phase will cause the phase detector 46 to drive the loop filter 48 to a new DC control voltage which in turn will drive the output of the VCO 42 to a new commanded frequency of N times the reference frequency ($f_r$).

During high speed tuning of the frequency synthesizer 34, the PLL 36 is operated in its open-loop configuration. The high speed tuning circuitry 38 is utilized and the learning circuitry 40 is isolated from the PLL 36. When operated in the open-loop configuration, switches S1–S6 are positioned in the opposite configuration as shown in FIG. 5. Switches S1–S6 are preferably fast switching field effect transistors (FET). However, one skilled in the art would find it apparent that any comparable high speed switching devices can be employed. It should also be noted that when high speed tuning to a new commanded frequency first occurs, the frequency synthesizer 34 is not tuning as fast and accurate as possible because learning has not yet occurred. However, once the frequency synthesizer 34 has been tuned to a commanded frequency and learning occurs at this frequency, the frequency synthesizer 34 will ideally be operating as fast and accurate as possible when subsequent tuning to the learned commanded frequency occurs. Furthermore, it should be noted that learning occurs each time the frequency synthesizer 34 is tuned to a commanded frequency to provide for component drift.

During the first phase of high speed open-loop tuning to a non-learned commanded frequency, switches S1, S2, S3 and S4 are closed while switches S5 and S6 are open. This subsequently causes the phase detector 46 to be removed from the PLL 36 by opening the switch S5 and closing the switch S1. The high speed tuning circuitry 38 is connected to the op-amp 50 contained in the loop filter 48 by closing switches S2, S3 and S4. This further causes the op-amp 50 to be configured as a straight amplifier adder with a resistor R4 feedback. In addition, the learning circuitry 40 is isolated from the frequency synthesizer by opening switch S6.

Thereafter, a command signal is applied to both a coarse tune digital-to-analog convertor (D/A) 52, and the digital divider 44. The resultant high speed coarse tune output from the coarse tune D/A 52, represented as $I_{ct}$, is applied to a hold down resistor R5 and the negative input of the op-amp 50 at a virtual-ground current-summing node 54. The virtual-ground current-summing node 54 is maintained by the ideal operation of op-amp 50. Furthermore, because op-amp 50 ideally has an infinite input impedance, the high speed coarse tune output ($I_{ct}$) is applied through the feedback resistor R4. This subsequently charges capacitor C2 to a new DC control voltage at TP1. This new DC control voltage drives the VCO 42 to substantially the commanded frequency without the need for the closed-loop operation of the PLL 36.

After capacitor C1 is charged, switches S1-S6 switch to the positions shown in FIG. 5 (closed-loop operation). This causes the high speed tuning circuitry 38 to be substantially isolated from the PLL 36 while connecting the learning circuitry 40 to the PLL 36. In addition, the phase detector 46 is again connected, through switch S5, to op-amp 50 which is again configured as an integrator. During this transition the DC control voltage on the VCO 42 is still maintained by the capacitor C1. Furthermore, since the VCO 42 is already substantially tuned to the commanded frequency by using the high speed coarse tune output from the coarse tune D/A 52, and the digital divider 44 has already been adjusted by the command signal which may include setting the correct initial phase, there should ideally be no output signal applied to the loop filter 48 from the phase detector 46.

However, since the VCO 42 was only tuned by the coarse tune D/A 52 (without learning), the phase detector 46 will most likely apply a correction signal to the loop filter 48. This correction signal will then drive the loop filter 48 to a new DC control voltage which will subsequently tune the VCO 42 to a more accurate commanded frequency.

Since the correction signal changes the DC control voltage at TP1, which thereby more accurately tunes the VCO 42, it is desired to learn this correction signal and apply it the next time the frequency synthesizer 34 is tuned to the same commanded frequency. To learn the correction signal each time tuning occurs, the learning circuitry 40 is employed. Essentially, since the correction signal changes the voltage at TP1 and the virtual-ground current-summing node 54 is still maintained after switching to the closed-loop operation by an operational amplifier (op-amp) 56 within the learning circuitry 40, an imbalance subsequently occurs at the node 54. This imbalance represented by the correction signal is applied to the negative input of the op-amp 56. The op-amp 56 is configured as a straight amplifier containing a resistor R6 and a variable resistor R7 feedback. The positive input of op-amp 56 is connected to ground, while the negative input is connected to the feedback loop. Since the op-amp 56 ideally has an infinite input impedance, the correction signal is applied through the resistors R6 and R7 and subsequently passes through the series resistor R8 at test point 2 (TP2). The signal at TP2 is applied to a fine tune analog-to-digital converter (A/D) 58 which subsequently digitizes the correction signal and applies it to a random access memory (RAM) 60. This data is then held in storage until the frequency synthesizer 34 is subsequently tuned to the learned commanded frequency.

Thus, when subsequent high speed tuning to the learned commanded frequency occurs (open-loop operation), the data stored in the RAM 60 is applied to a fine tune digital-to-analog converter (D/A) 62 within the high speed tuning circuitry 38. The analog output from the fine tune D/A 62 is applied to a hold-down resistor R9 and an operational amplifier (op-amp) 64. The op-amp 64 is configured as a straight amplifier containing a resistor R10 feedback. The positive input of op-amp 64 is connected to ground, while the negative input is connected to the feedback loop. Since the input impedance of the op-amp 64 is ideally infinite, the analog signal passes through the resistor R10 and a series resistor R11. This high speed fine tune signal, represented by $I_{ft}$, is then summed to the high speed coarse tune signal ($I_{ct}$) from the coarse tune D/A 52 at the node 54. The resultant high speed tuning signal tunes the VCO 42 to a more accurate commanded frequency. Furthermore, one skilled in the art would recognize that the frequency synthesizer 34 can be configured to operate with only one D/A doing the work of both the coarse tune D/A 52 and fine tune D/A 62.

Thereafter, during subsequent closed-loop operation of the frequency synthesizer 34, the switch S4 is opened which creates an additional imbalance at node 54 due to the removal of the high speed fine tune signal ($I_{ft}$). As a result, both the high speed fine tune signal ($I_{ft}$) and any correctional signal that may result from tuning the VCO 42, is applied to the learning circuitry 40 through the switch S6. The resultant correction signal is then stored in RAM 60 until the frequency synthesizer 34 is subsequently tuned to the learned commanded frequency.

Furthermore, it should be noted that the learning circuitry 40 can also be configured with an accumulator 64. In this configuration the RAM 60 is incremented up or down depending on the correction signal. This is basically achieved by keeping the switch S4 closed during closed-loop operation which thereby does not create the additional imbalance at the node 54 by removing the high speed fine tune signal ($I_{ft}$). As a result, the accumulator 64 in the learning circuitry 40 will merely increment the RAM 60 up or down depending on the correction signal as opposed to relearning both the high speed fine tune signal ($I_{ft}$) and the correction signal.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined by the following claims.

What is claimed is:

1. A low noise high speed frequency synthesizer employing a learning sequence to enable high speed tuning to a desired commanded frequency, said low noise high speed frequency synthesizer comprising:

frequency synthesizer means for generating the commanded frequency, said frequency synthesizer means operable to receive a first command signal for tuning to the commanded frequency;

high speed tuning means for high speed tuning the frequency synthesizer means to substantially the desired commanded frequency, said high speed tuning means operable to transmit a high speed tuning signal to the frequency synthesizer means, said high speed tuning means including first switch means for substantially isolating the high speed tuning means from the frequency synthesizer means after high speed tuning has occurred; and learning means for reading a correction signal generated by the frequency synthesizer means, said correction signal being representative of the difference between the frequency of the frequency synthesizer means as tuned by the high speed tuning means and the desired commanded frequency, said learning means operable to transmit the correction signal to the frequency synthesizer means as a fine tune signal along with the high speed tuning signal at a time that the frequency synthesizer means is to be tuned to the commanded frequency after a first time the frequency synthesizer means has been tuned to the commanded frequency, said correction signal enabling the high speed tuning means to more accurately high speed tune to substantially the commanded frequency once the learning means has learned the correction signal for the commanded frequency.

2. The frequency synthesizer as defined in claim 1 wherein the frequency synthesizer means includes a phase-locked loop (PLL), said PLL operable to generate the commanded frequency.

3. The frequency synthesizer as defined in claim 2 wherein the phase-locked loop (PLL) includes a voltage controlled oscillator (VCO), a phase detector, a digital divider and a loop filter, said VCO operable to generate the commanded frequency proportional to a DC control voltage, said phase detector operable to generate the DC control voltage proportional to the phase difference between a reference signal and an input signal, and said digital divider operable to receive the first command signal to subsequently adjust the VCO.

4. The frequency synthesizer as defined in claim 3 wherein the loop filter includes an operational amplifier, said operational amplifier including a capacitor resistor feedback, wherein the capacitor is operable to store the high speed tuning signal after the high speed tuning signal means is substantially isolated from the frequency synthesizer means.

5. The frequency synthesizer as defined in claim 1 wherein the high speed tuning means includes a fine tune digital-to-analog converter (D/A), said fine tune D/A operable to receive a learned command signal and transmit a proportional high speed fine tune analog signal.

6. The frequency synthesizer as defined in claim 5 wherein the high speed fine tune analog signal enters the frequency synthesizer means at a virtual-ground-current-summing node, said virtual-ground current-summing node maintained after the fine tune D/A is substantially isolated from the frequency synthesizer means.

7. The frequency synthesizer as defined in claim 6 wherein the high speed tuning means further includes a coarse tune digital-to-analog converter (D/A), said coarse tune D/A operable to receive a second command signal and transmit a proportional high speed coarse tune analog signal.

8. The frequency synthesizer as defined in claim 7 wherein the high speed tuning signal comprises the high speed coarse tune analog signal and the high speed fine tune analog signal.

9. The frequency synthesizer as defined in claim 1 wherein the learning means includes a fine tune analog-to-digital converter (A/D) and a storage means, said fine tune A/D operable to read and digitize the correction signal, said storage means operable to store the digitized information.

10. The frequency synthesizer as defined in claim 9 further comprising fine tune digital-to-analog converter (D/A), said fine tune digital-to-analog convertor being operable to convert the digitized information from the storage means into a high speed fine tune analog signal.

11. The frequency synthesizer as defined in claim 10 wherein the correction signal enters the learning means at a virtual-ground current-summing node.

12. The frequency synthesizer as defined in claim 11 wherein the learning means further includes an operational amplifier (op-amp) with a variable resistor feedback for adjusting the op-amp gain, said op-amp connected to the fine tune A/D and being operable to apply the correction signal to the fine tune A/D and maintain the virtual-ground current-summing node.

13. The frequency synthesizer as defined in claim 9 wherein the learning means further includes an accumulator, said accumulator operable to increment the storage means.

14. The frequency synthesizer as defined in claim 9 wherein the storage means further includes random access memory (RAM), said RAM operable to store the digitized information from the fine tune A/D.

15. The frequency synthesizer as defined in claim 9 wherein the fine tune A/D reads the correction signal plus the high speed fine tune analog signal.

16. A low noise high speed frequency synthesizer employing a learning sequence to enable high speed tuning to a desired commanded frequency, said low noise high speed frequency synthesizer comprising:
a phase-locked loop (PLL), said PLL operable to receive a first command signal and generate the commanded frequency;
a coarse tune digital-to-analog converter (D/A), said coarse tune D/A operable to receive a second command signal and transmit a proportional high speed coarse tune analog signal;
a fine tune digital-to-analog (D/A) converter, said fine tune D/A operable to receive a learned command signal and transmit a proportional high speed fine tune analog signal, said high speed coarse tune analog signal and said high speed fine tune analog signal operable to high speed tune the PLL to substantially the commanded frequency, said coarse tune D/A and said fine tune D/A further being operable to be substantially isolated from the PLL after high speed tuning has occurred; and
learning means for learning a correction signal generated by the PLL, said correction signal being representative of the difference between the commanded frequency of the PLL as tuned by the coarse tune D/A and the desired commanded frequency, said learning means operable to read, store and transmit the correction signal after high speed tuning has occurred, said correction signal subsequently enabling the fine tune D/A to more accurately high speed tune to substantially the commanded frequency once the learning means has learned the correction signal for the commanded frequency.

17. The frequency synthesizer as defined in claim 16 wherein the learning means includes a fine tune analog-to-digital convertor (A/D) and a storage means, said fine tune A/D operable to read and digitize the correction signal, said storage means operable to store the digitized information.

18. The frequency synthesizer as defined in claim 17 wherein the storage means includes random access memory (RAM), said RAM operable to store the digitized information from the fine tune A/D.

19. A method of high speed tuning to a commanded frequency, said method comprising the steps of:
providing a frequency synthesizer means for generating the commanded frequency;
high speed tuning the frequency synthesizer means to the commanded frequency with a high speed tuning means;
substantially isolating the high speed tuning means from the frequency synthesizer means after high speed tuning to the commanded frequency has occurred;
learning a correctional signal to subsequently enable the high speed tuning means to more accurately high speed tune the frequency synthesizer means to substantially the commanded frequency, said correctional signal being generated by the frequency synthesizer means and being representative of the difference between the commanded frequency as tuned by the step of high speed tuning and a more accurate frequency.

20. The method as defined in claim 19 further comprising the step of:
employing the correctional signal with the high speed tuning means to more accurately tune the frequency synthesizer to substantially the commanded frequency.

21. The frequency synthesizer according to claim 1 further comprising second switch means for disconnecting a phase detector associated with the frequency synthesizer means during the high speed tuning and a third switch means for disconnecting the learning means during the high speed tuning.

22. The frequency synthesizer according to claim 1 further comprising second switch means for disconnecting the fine tune signal from the frequency synthesizer after high speed tuning has occurred.

* * * * *